United States Patent [19]

Peled et al.

[11] 4,360,779

[45] Nov. 23, 1982

[54] MEASURING DEVICE FOR ELECTRICAL CELLS

[75] Inventors: Emanuel Peled, Even Yehuda; Chaim N. Yarnitzky, Haifa, both of Israel

[73] Assignee: Ramot University Authority for Applied Research and Industrial Development Ltd., Ramat-Avid, Israel

[21] Appl. No.: 172,656

[22] Filed: Jul. 28, 1980

[51] Int. Cl.³ .......................................... G01N 27/42
[52] U.S. Cl. .................................. 324/434; 324/436
[58] Field of Search ............... 324/434, 430, 429, 436

[56] References Cited

U.S. PATENT DOCUMENTS 3,808,487  4/1974  Feuillade ............................ 324/436
4,284,951  8/1981  Dahl .................................. 324/436

*Primary Examiner*—Michael J. Tokar
*Attorney, Agent, or Firm*—Fleit & Jacobson

[57] ABSTRACT

The present invention relates to apparatus and methods for measuring the different potential drops in electrochemical cells (EC), i.e. measuring independently the following: anodic and cathodic over potentials (IR free) each half cell ohmic solution resistance and each half cell solution potential drop (IR drop). This invention is applicable to electrochemical cells such as: batteries, electroplating baths, water electrolyzers and other EC operating continuously.

6 Claims, 7 Drawing Figures

MEASURING DEVICE FOR ELECTRICAL CELLS

BACKGROUND OF THE INVENTION

In a rechargeable battery, as in other conventional electrochemical systems during current flow, the voltage across the terminals is influenced by the electrochemical reactions which occur near the battery electrodes, by polarization near the electrodes and by the internal resistance of each half cell.

Methods are known for measuring the quality of a battery in which the over-all internal resistance of the galvanic cell or battery is measured by a pulsed current. Examples of such techniques are described in U.S. Pat. Nos. 2,662,211 and 2,864,055 and in an article by K. Koresch and A. Marko entitled "Sine Wave Pulse Current Tester for Batteries" J.E.C.S. Vol. 107, p. 480 (1960). In these methods it is assumed that the voltage drop attributable to polarization remains substantially constant when the load or the current source is disconnected for a short period. A pulsed current, rather than a constant current is therefore passed through the cell and the voltage of the cell is measured between pulses when the current is zero. The measured voltage is termed the "modified terminal voltage" and differs from the "terminal voltage" usually measured across the load by the current-resistance potential drop.

The modified terminal voltage is used to determine the battery capacity. In conventional practice, the battery is charged at a rapid rate with a constant current for a short period and the modified terminal voltage is measured at the beginning and end of a predetermined interval within that period. The differences in measured modified terminal voltage indicate changes in battery capacity. A similar measurement can be made during battery discharge.

By comparing a plurality of batteries of the same type during periodic charging and discharging, it is possible to indicate which of the batteries are exhausted. Such conventional techniques are not, however, helpful when it is sought to determine the capacity of newly designed or nonstandard batteries whose characteristics are not known in advance, and where each half cell of the battery must be checked independently.

SUMMARY OF THE INVENTION

The present invention seeks to provide an apparatus and method for EC testing suitable for use with EC where each half cell must be checked independently.

There is thus provided in accordance with an embodiment of the present invention EC testing apparatus comprising means for applying a constant current and a superimposed alternating current to a cell being tested, and sensing means coupled to the cell terminals and to the current applying means for providing an output indication of electrode polarization potential, solution Ohmic resistance and solution potential drop of each half cell.

Additionally in accordance with an embodiment of the present invention, means are provided for simultaneously displaying the electrode polarization potential, solution resistance and solution potential drop of each half cell.

Further in accordance with an embodiment of the invention there is provided a method for EC testing comprising the steps of applying a constant current and a superimposed alternating current to a cell being tested and sensing the voltages at the terminals of the cell being tested and providing in response thereto an output indication of electrode polarization potential, solution resistance and solution potential drop of each half cell in said cell being tested.

BRIEF DESCRIPTION OF THE DRAWINGS

The invention will be more fully understood and appreciated from the following detailed description taken in conjunction with the drawings in which.

DESCRIPTION OF THE PREFERRED EMBODIMENT

Figure 1:
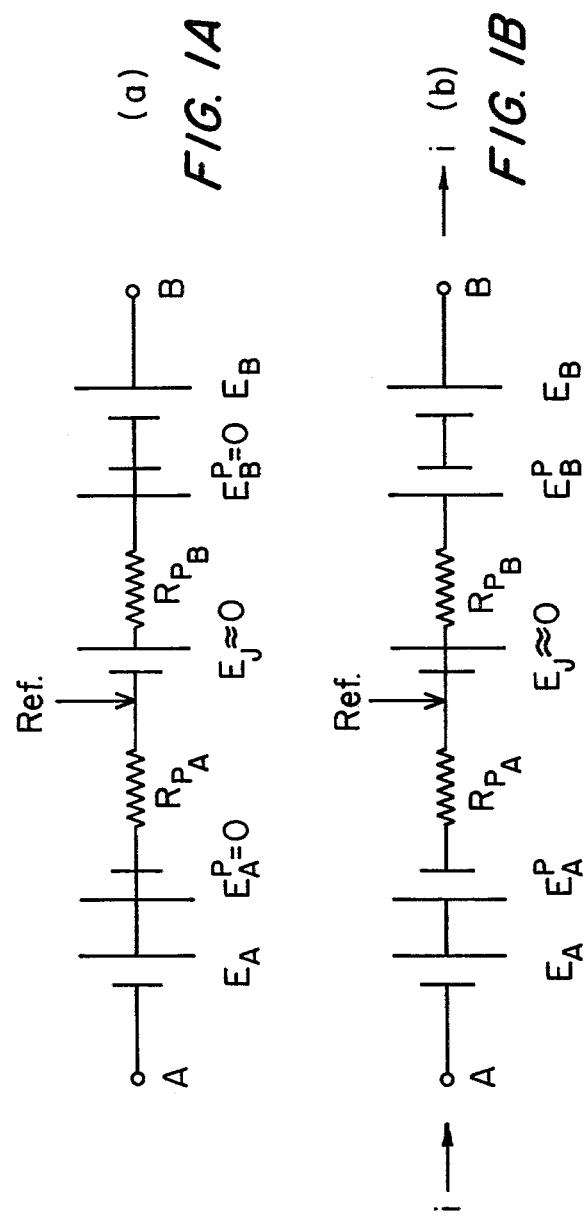
FIGS. 1A and 1B show an equivalent circuit of a galvanic cell respectively under open circuit conditions and after a current has been passed therethrough for a given time.

For the sake of better understanding of the operation of the invention, equivalent circuit diagrams of a galvanic cell are provided in FIGS. 1A and 1B to which reference is now made. The open circuit case is shown in FIG. 1A and here the open circuit voltage across respective negative and positive cell terminals A and B is the sum of the negative and positive electrode voltages $E_A$ and $E_B$ measured with respect to the Reference. The polarization voltages $E_A^P$ and $E_B^P$ are zero under open circuit conditions as are the voltages across the resistors $R_{PA}$ and $R_{PB}$, which correspond to the solution resistance of the negative and positive half cell respectively.

Referring now to FIG. 1B which illustrates the same cell when a current i is passing therethrough, it is seen that immediate solution potential drops $iR_{PA}$ and $iR_{PB}$ appear across the respective negative and positive electrode resistances. Additionally polarization voltages $E_A^P$ and $E_B^P$ are built up over time because of the imperfect action of the depolarizer present in the battery, if one is present. Where no depolarizer is present polarization voltages arise only from the change in concentration of the electroactive material near the electrodes. Kinetic effects are here excluded.

In both the open circuit and current flow cases illustrated respectively in FIGS. 1A and 1B, $E_j$ a voltage due to the difference between the solutions of the positive and negative electrode compartments may be neglected.

The terminal voltage is the open circuit voltage minus the sum of the solution potential drops and the polarization voltages.

Figure 2:
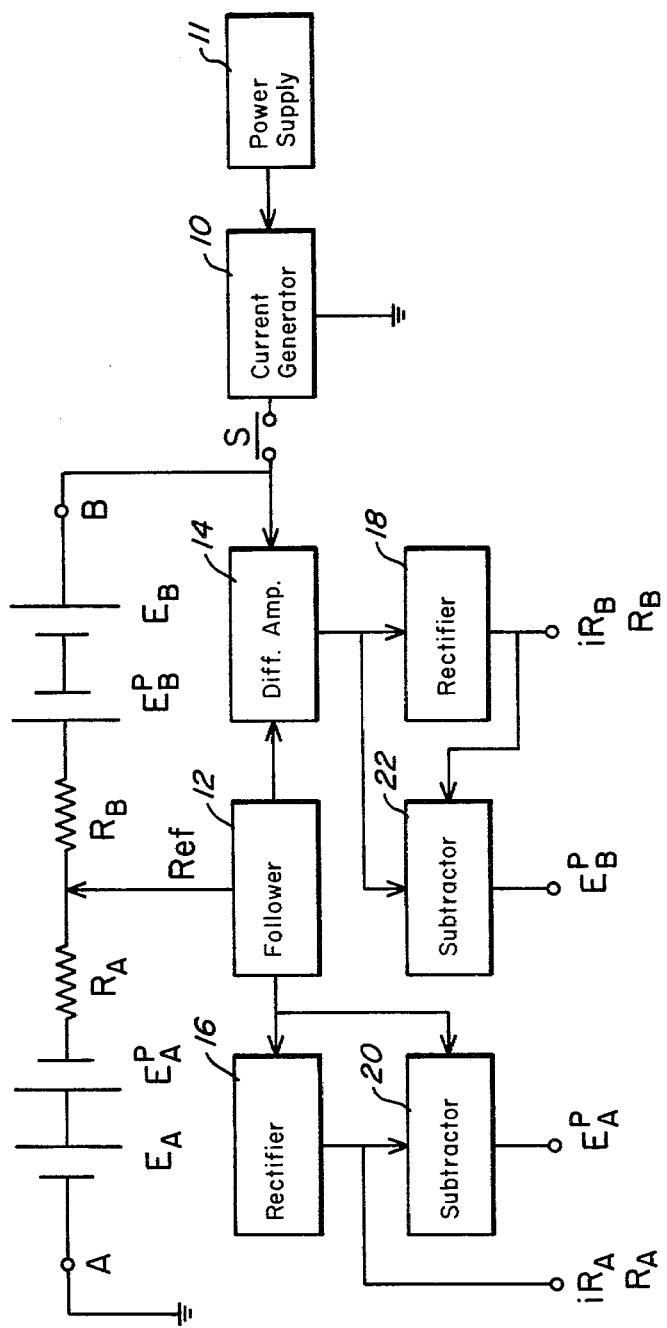
FIG. 2 is a schematic block diagram of EC testing apparatus constructed and operative in accordance with an embodiment of the present invention.

Reference is now made to FIG. 2 which illustrates a battery testing apparatus constructed and operative in accordance with an embodiment of the invention in association with an equivalent circuit of a galvanic cell. Here negative terminal A is grounded, while positive terminal B is coupled via a switch to a current generator 10 powered by a power supply 11. Current generator 10 supplies a constant current with a superimposed square wave current to the equivalent circuit.

A follower 12 measures the voltage appearing at the reference terminal REF and supplies that voltage to a differential amplifier 14 and to a square wave rectifier 16. Since the square wave current is a constant part of the direct current, the output of the rectifier is equal to the constant current-resistance potential drop across $R_A$, multiplied by a given constant, here chosen to be 80.

Similarly to the connection of the rectifier 16 to follower 12, the output of differential amplifier 14 is coupled to a square wave rectifier 18. It is noted that a differential amplifier is not required at the negative side of the equivalent circuit since terminal A is coupled to ground, as compared with terminal B which is floating.

Square wave rectifier 18 provides an output equal to the constant current-resistance potential drop across $R_B$ multiplied by a given constant, here chosen to be 80. It is thus possible to determine the solution resistances $R_A$ and $R_B$ by dividing the respective potential drops $iR_A$ and $iR_B$ by the current i.

The output of follower 12 is supplied to a subtractor 20 which also receives the output from rectifier 16 and subtracts the potential drop and the open circuit voltage of the negative electrodes $E_A$, (which is measured at the beginning when the switch S is open) from the voltage measured at any time during current flow between terminal A and the REF terminal. The output of subtractor 20 is equal to the IR free polarization voltage of the positive electrode $E_A^P$.

Similarly the output of differential amplifier 14 and the output of rectifier 18 are supplied to a subtractor 22 which provides an output equal to the IR free polarization voltage of the positive electrode $E_B^P$.

Display of the various outputs may be via meters, LED displays or any other suitably rugged display means.

Figure 3:
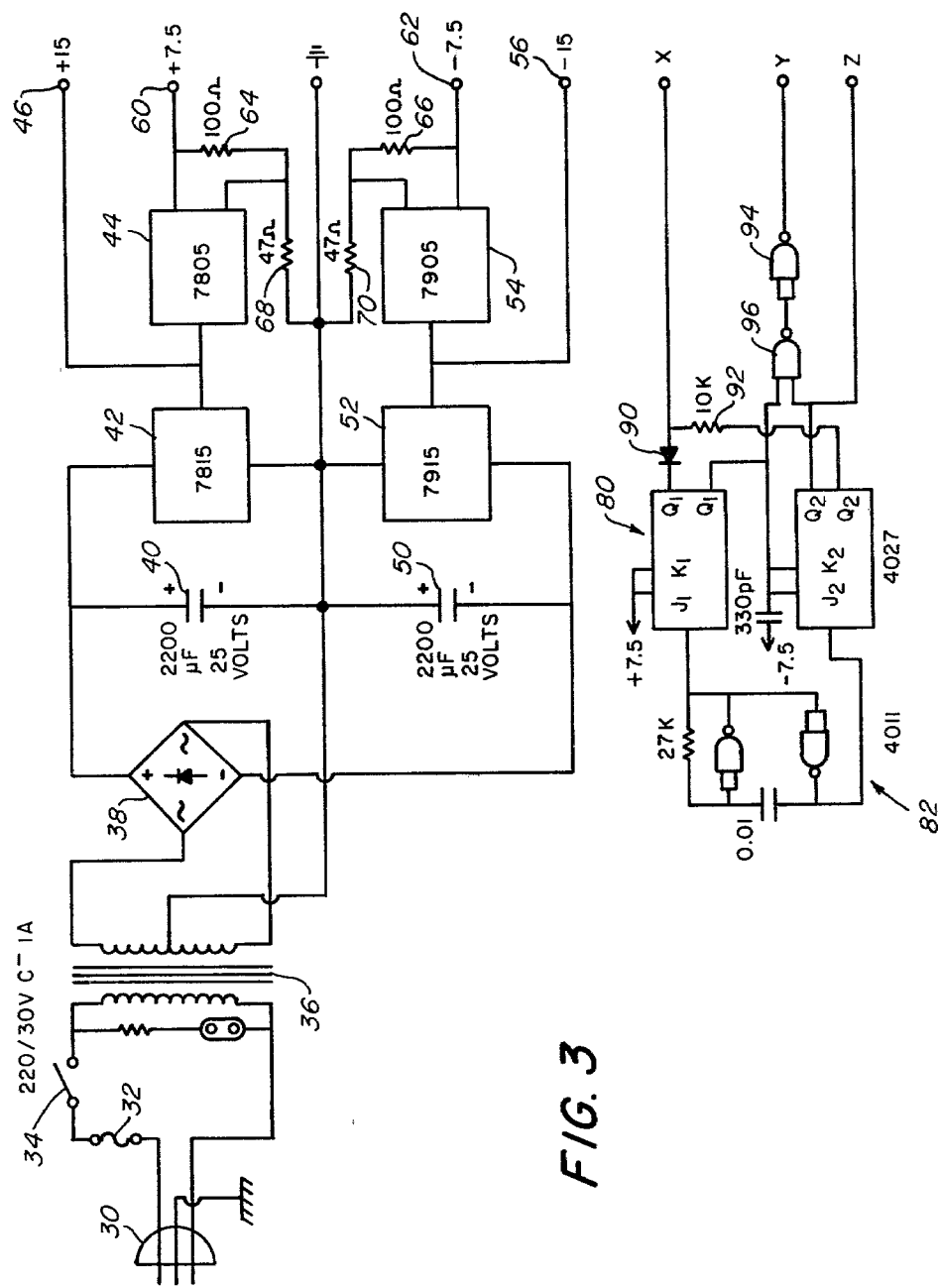
FIG. 3 is a circuit diagram of a power supply forming part of the apparatus of FIG. 2.

Reference is now made to FIG. 3 which illustrates the electronic circuity of a power supply for use in the apparatus of FIG. 2. AC line current at 220 Volts is supplied as from a conventional plug 30 insertable into a wall socket (not shown). An electrical conductor connects plug 30 via a fuse 32 and a cut-off switch 34 to a transformer 36 which steps down the voltage to 30 Volts. The output of transformer 36 is coupled to a bridge rectifier 38. The positive DC output of rectifier 38 is coupled across a capacitor 40, typically 2200 microfarads, 25 Volt, to ground and to a 7815 chip 42 which also has a ground connection and is connected to a 7805 chip 44 via a conductor which is also connected to a +15 Volt output terminal 46.

Similarly the negative DC output of rectifier 38 is coupled across a capacitor 50 to ground and to a 7915 chip 52 which also has a ground connection and is connected to a 7905 chip 54 via a conductor which is also connected to a −15 Volt output terminal 56. Chip 44 has a +7.5 Volt output 60 while chip 7905 has a −7.5 Volt output 62. Outputs 60 and 62 are each coupled to ground via a 100 Ω resistor 64 and 66 respectively and a 47 Ω resistor 68 and 70 respectively. The junction between resistors 64 and 68 is coupled to a terminal of chip 44 while the junction of resistors 66 and 70 is likewise coupled to a terminal of chip 54.

Connected to the + and −7.5 volt outputs is a dual flip-flop 80 embodied in a 4027 chip. Complementary outputs of an oscillator 82 of conventional construction and embodied in a 4011 chip are coupled to respective clock inputs of the dual flip-flop 80.

The $Q_1$ output of chip 4027 is coupled to an X output terminal via a diode 90 and is coupled via a resistor 92, typically of value 10 K, to the $Q_2$ output of chip 4027.

A Y output terminal receives the output from an inverter 94 which in turn receives the output from a NAND gate 96, one of whose inputs is connected to the $J_2$ and $K_2$ inputs of chip 4027 and one of whose outputs is coupled to the $Q_2$ output of chip 4027 and to output terminal Z.

Figure 6:
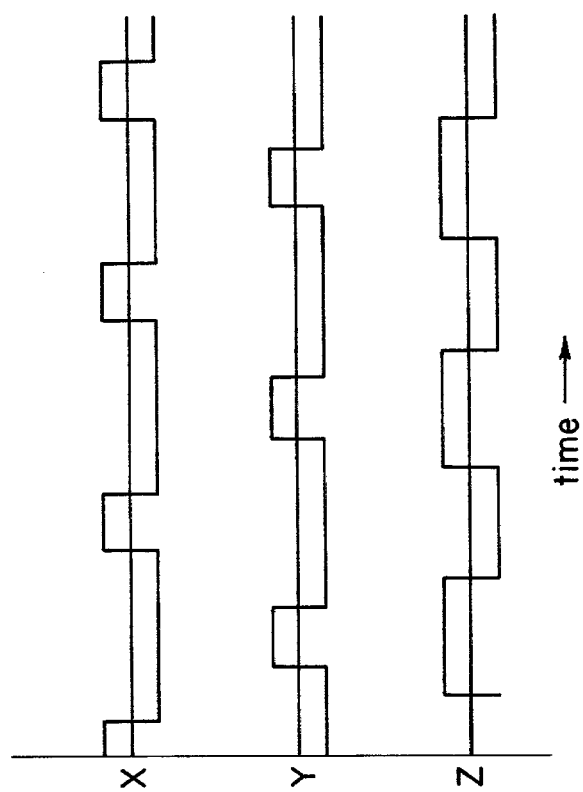
FIG. 6 illustrates waveforms seen at points x, y and z in FIG. 3.

The waveforms of the outputs at terminals X, Y and Z are illustrated schematically in FIG. 6.

Figure 4:
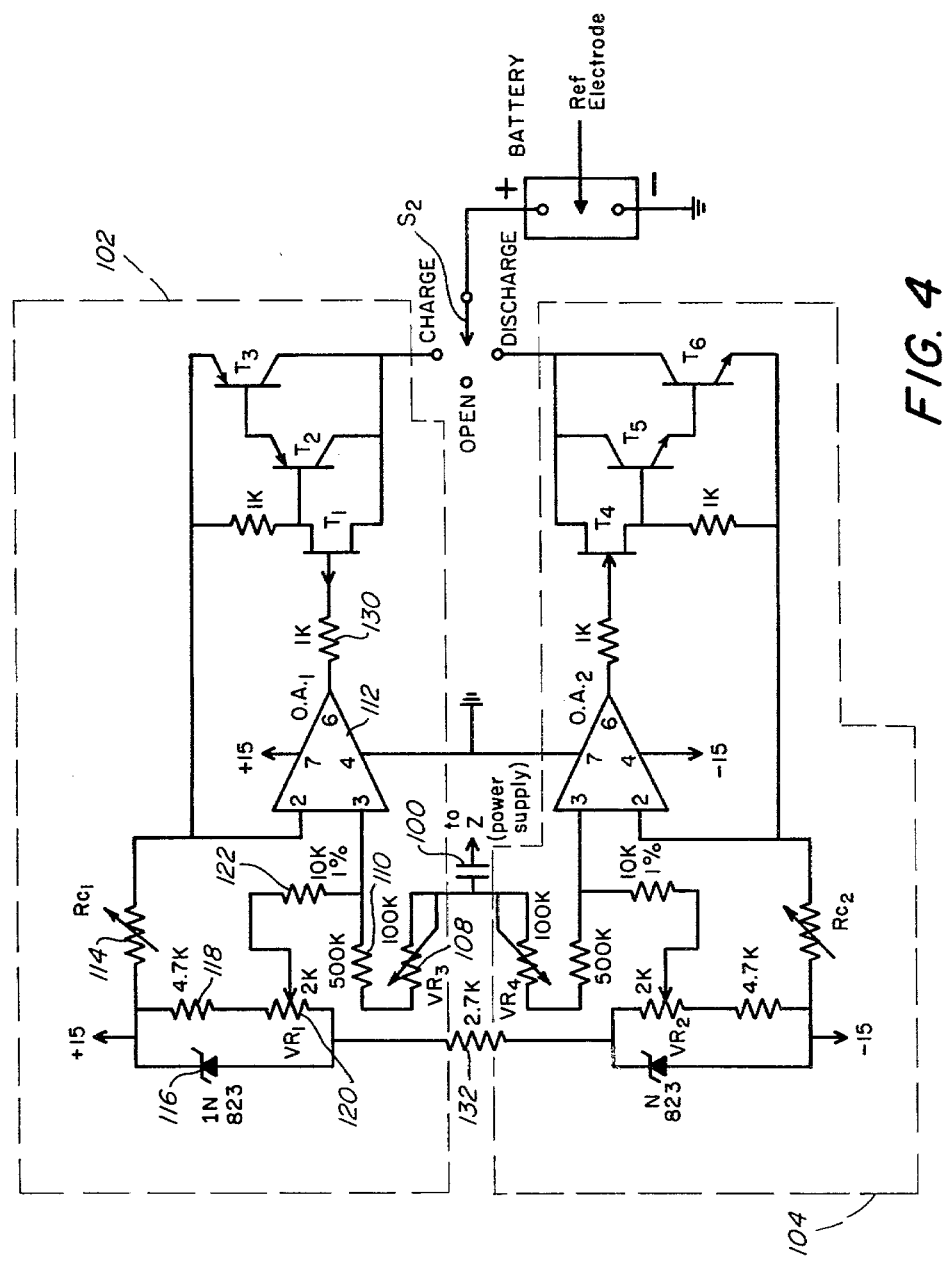
FIG. 4 is a circuit diagram of a current generator forming part of the apparatus of FIG. 2.

Reference is now made to FIG. 4 which illustrates a current generator forming part of the apparatus of FIG. 2. The Z terminal of the power supply (FIG. 3) is coupled across a capacitor 100 0.1 uF to parallel circuitry, one side of which is connected to a CHARGE terminal and the other side of which is connected to a DISCHARGE terminal. The two parallel circuits which are substantially identical except for differences which will be specified hereinafter are designated by boxes 102 and 104 respectively. In order to avoid unnecessary repetition, only the circuitry in block 102 will be described in detail, it being understood that the circuitry in block 104 is identical thereto except as set forth hereinafter.

Connected to capacitor 100 is a variable resistor 108 and a resistor 110 of typical value 500 K, in series. Resistor 110 is coupled to input terminal 3 of an operational amplifier 112. Terminal 7 of operational amplifier 112 is coupled to a source of +15 Volts D.C. and terminal 2 of the operational amplifier is coupled across a variable resistor 114 to the +15 Volt DC source. A parallel combination of a diode 116 such as in IN 823 and series resistors 118 and 120 is coupled via a resistor 122, typically of value 10 K, between the +15 V DC source and terminal 3 of operational amplifier 112. Resistor 118 is of typical value 4.7 K while resistor 120 is a variable resistor whose moving contact is connected to resistor 122.

Output terminal 6 of operational amplifier 112 is coupled across a resistor 130, typically of value 1 K to a combination of 3 transistors $T_1$, $T_2$ and $T_3$ being a p-channel FET, a pnp driver transistor and a (pnp) power transistor respectively which are connected in a conventional high input impedance Darlington arrangement with their collectors and drains all coupled to the CHARGE terminal.

Terminal 4 of the operational amplifier is grounded.

The circuitry in block 104 is identical to the circuitry described above with the following exceptions: Terminal 4 of the operational amplifier in block 104 is coupled to a −15 V DC power source as is the junction between the analogous variable resistor 114 and the parallel combination. Terminal 7 of the operational amplifier in block 104 is grounded. The transistor combination in block 104 is complementary to that in block 103 using a n-channel FET and npn transistors instead of a p-channel FET and pnp transistors, and the terminals thereof are coupled to the DISCHARGE TERMINAL.

A switch $S_2$ is provided for selectively coupling the positive terminal of a battery being tested either to the CHARGE or DISCHARGE terminals, the negative terminal of the battery being grounded.

The parallel combinations of blocks 102 and 104 are connected by a resistor 132 typically of value 2.7 K.

The transistor combination in block 102 generates a positive current while the transistor combination in block 104 generates a negative current. Variable resistors 114 in each block determine the magnitude of the current. Variable resistors 108 in each block determine the constant currents while variable resistors 120 in each block determine the superimposed currents.

Figure 5:
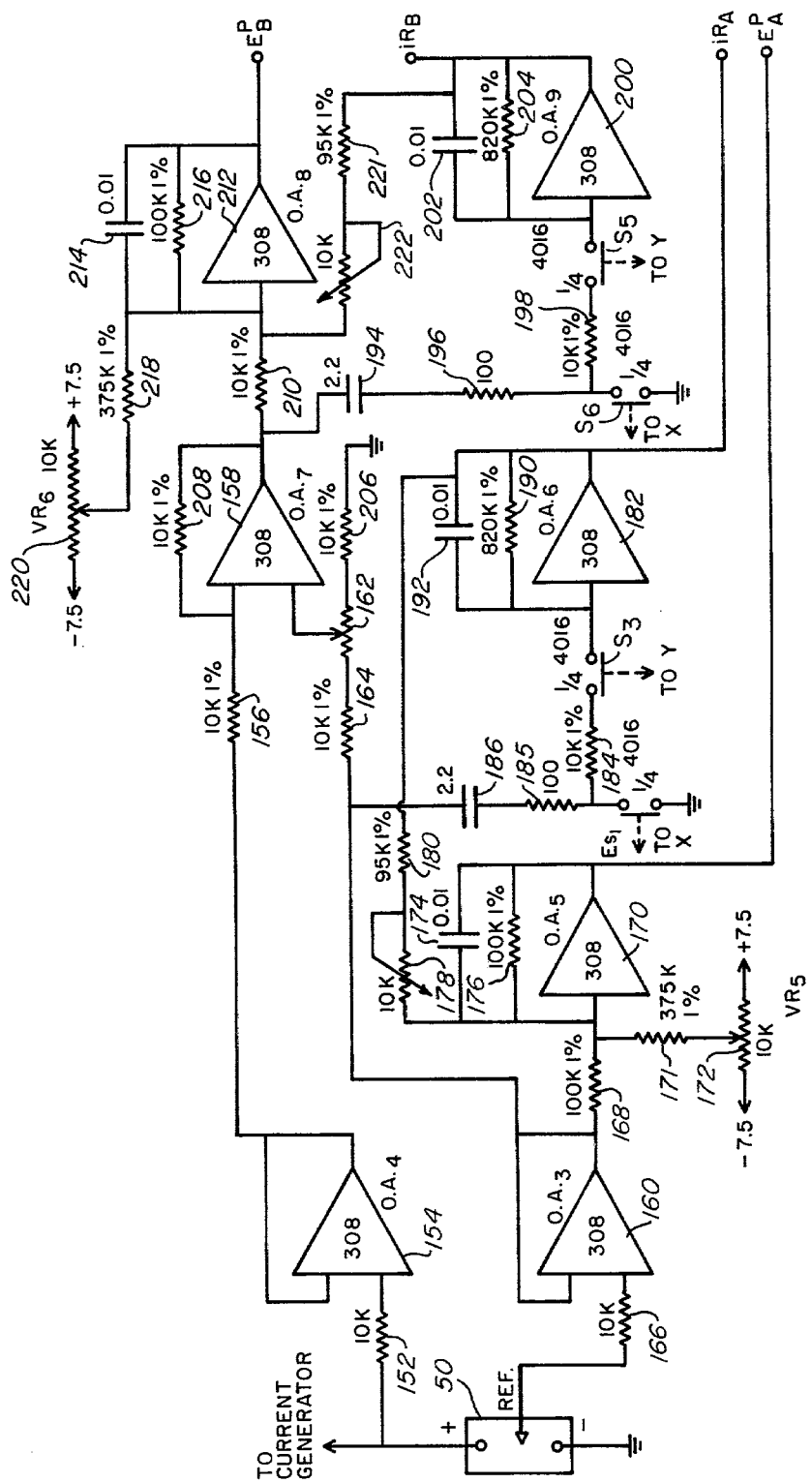
FIG. 5 is a circuit diagram of voltage analyzing circuitry forming part of the apparatus of FIG. 2.

Reference is now made to FIG. 5 which shows an embodiment of a voltage analyzer constructed and operative in accordance with an embodiment of the present invention.

The positive terminal of a battery 150 being tested is coupled to the current generator described in FIG. 4 hereinabove and also is coupled via a resistor 152 in an input of an operational amplifier 154. The output of operational amplifier 154 is fed back to an input thereof and is also supplied via a resistor 156 to a feedback input of an operational amplifier 158. Operational amplifier 158 also receives an input from the output of an operational amplifier 160 via a variable resistor 162 and series connected resistor 164. Operational amplifier 160 receives an input via a resistor 166 from the REF terminal of the battery being tested and also receives the fed back output thereof.

The output of operational amplifier 160 is also supplied via a resistor 168 to the input of an operational amplifier 170, whose output is supplied at a terminal designated $E_A^P$ and indicates the negative polarization voltage. The input to operational amplifier 170 is also coupled via a resistor 171 to a variable resistor 172 having connections to +7.5 V DC and −7.5 V DC at opposite poles thereof.

The input to operational amplifier 170 also receives the fed back output thereof via the parallel combination of a capacitor 174 and a resistor 176, and is also coupled via a variable resistor 178 and a series connected resistor 180 to the output of an operational amplifier 182 which is directly coupled to a terminal designated $iR_A$ and indicating the voltage drop across the negative electrode. Operational amplifier 182 receives an input via a switch $S_3$ and resistors 184 and 185 and a capacitor 186 from the output of operational amplifier 160.

The junction of resistors 184 and 185 is selectively coupled to ground across a switch $S_4$ whose operation is governed by the output at the X terminal of the power supply (FIG. 3). Switch $S_3$ is governed by the output at the Y terminal of the power supply (FIG. 3). The output of operational amplifier 182 is fed back to the input thereof via a parallel combination of a resistor 190 and a capacitor 192.

The output of operational amplifier 158 is coupled via a capacitor 194, resistors 196 and 198 and a switch $S_5$, all connected in series, to the input of an operational amplifier 200, whose output is supplied to a terminal designated as $iR_B$ and indicates the voltage drop across the positive electrode. The junction of resistors 196 and 198 is coupled to ground via a switch $S_6$. The operation of switch $S_5$ is governed by the output of the power supply at the Y terminal, while the operation of the switch $S_6$ is governed by the power supply output at terminal X. The output of operational amplifier 200 is fed back to the input thereof via a parallel combination of a capacitor 202 and a resistor 204.

Variable resistor 162 is coupled to ground across a resistor 206.

The output of operational amplifier 158 is fed back to an input thereof via a resistor 208 and is also supplied via a resistor 210 to the input of an operational amplifier 212 whose output is supplied to a terminal designated $E_B^P$ and indicating the positive polarization voltage. The output of operational amplifier 212 is fed back to the input thereof via a parallel combination of a capacitor 214 and a resistor 216. The input to operational amplifier 212 is also coupled via a resistor 218 to a variable resistor (voltage selector) 220, having terminals connected to −7.5 V DC and to +7.5 V DC.

The input to amplifier 212 is connected to terminal $iR_B$ by a resistor 221 and a variable resistor 222.

Typical specifications and values for the various elements in the embodiment of FIG. 5 are given below:

| Resistors (in Ohms) | | | | Operational Amplifiers (Chip Numbers) |
|---|---|---|---|---|
| 185 | 100 | 152 | 10K | 154 Model 308 |
| 190 | 820K | | | |
| 196 | 100 | 156 | 10K | 158 Model 308 |
| 198 | 10K | 162 | 200 | 160 Model 308 |
| 204 | 820K | 164 | 10K | 170 Model 308 |
| 206 | 10K | | | |
| 208 | 10K | 166 | 10K | 182 Model 308 |
| 210 | 10K | 168 | 100K | 200 Model 308 |
| 216 | 100K | 171 | 375K | |
| 218 | 375K | 172 | 10K (Max.) | 212 Model 308 |
| 220 | 10K (Max.) | 176 | 100K | |
| | | 178 | 10K (Max.) | |
| | | 180 | 95K | |
| | | 184 | 10K | |
| Capacitors (in Microfarads) | | | | |
| 174 | | | 0.01 | |
| 186 | | | 2.2 | |
| 192 | | | 0.01 | |
| 194 | | | 2.2 | |
| 202 | | | 0.01 | |
| 214 | | | 0.02 | |
| 218 | | | 375K | |

In practice the REF electrode is immersed in the electrolyte of the battery and placed between the positive and negative electrodes. Operational amplifier 154 and 160 are followers which transfer the potentials measured to the differential amplifier, (operational amplifier 158) and to the subtractor, operational amplifier 170. Any alternating potential due to a resistive element in the battery is rectified and amplified by means of the square wave rectifiers comprising electronic switches (S-3, S-4, S-5 and S-6) and operational amplifiers 190 and 200.

Operation of the above described apparatus is commenced by disconnecting the current generator by means of switch $S_2$ (FIG. 4). The potentiometers 172 and 220 are set to give a zero reading at terminals $E_A^P$ and $E_B^P$ on the assumption that the battery has not been operated shortly before the test. The current generator is then connected and the various functions may be checked and recorded.

It will be appreciated by persons skilled in the art that only specific embodiments of the invention have been specifically shown and described herein. The invention is not limited to what has been specifically shown and described hereinabove. Rather, the scope of the invention is defined only by the claims which follow:

We claim:

1. Electrochemical cell testing apparatus for testing the storage capacity of an electrochemical battery including two half-cells, which apparatus comprises:
   current applying means for applying a constant current and a superimposed alternating current to said battery; and sensing means for connection with cell terminals associated with each half-cell and to the current applying means for sensing and indicating with respect to at least one half-cell over potential difference, solution resistance and solution potential difference.

2. Electrochemical cell testing apparatus according to claim 1 wherein said sensing means simultaneously senses and indicates with respect to each half-cell over potential difference, solution resistance and solution potential difference.

3. Electrochemical cell testing apparatus according to claim 1 wherein the anode terminal of said battery is grounded and said current applying means is connected to the cathode terminal of said battery and wherein said sensing means comprises:

a voltage detector coupled to a reference terminal immersed in the electrolyte between the anode and cathode;

a differential amplifier receiving the output of said voltage detector;

a first rectifier receiving the output of said voltage detector and providing an output proportional to the constant current-resistance potential drop across a first of said half-cells; and a second rectifier receiving the output of said differential amplifier and providing an output proportional to the constant current-resistance potential drop across a second of said half-cells.

4. Electrochemical cell testing apparatus according to claim 3 and also comprising:

a first subtractor receiving the outputs of said voltage detector and of said first rectifier for indicating the overpotential difference of the first half-cell; and a second subtractor receiving the outputs of said differential amplifier and of said second rectifier for indicating the overpotential difference of the second half-cell.

5. A method for electrochemical cell testing of a battery including first and second half-cells comprising the steps of:

applying a constant current and a superimposed alternating current to the battery being tested; and sensing the voltage of the first and second terminals of each cell being tested and providing in response thereto an output indication of overpotential difference, solution-resistance and current-solution resistance potential drop of each half cell in said battery being tested.

6. A method according to claim 5 and wherein said sensing and providing step comprises the steps of:

sensing the voltage of a reference terminal immersed in the electrolyte between negative and positive electrodes of a battery being tested;

rectifying the sensed voltage at said reference terminal to provide an output proportional to the constant current-solution-resistance voltage drop across a first electrode associated with said first terminal;

supplying the sensed voltage to a differential amplifier;

rectifying the differential amplifier output to provide an output proportional to the constant current-solution-resistance voltage drop across a second electrode associated with said second terminal;

determining the differences between said sensed output and the rectified sensed voltage to provide an indication of the over-voltage of said first electrode; and determining the difference between the output of said differential amplifier and the rectified output of said differential amplifier to provide an indication of the over-voltage of said second electrode.

* * * * *